(12) United States Patent
Liao et al.

(10) Patent No.: US 11,222,833 B2
(45) Date of Patent: Jan. 11, 2022

(54) MICRO-HEATERS IN A FILM STRUCTURE MOUNTED ON A SUBSTRATE BETWEEN A PLURALITY OF ELECTRONIC COMPONENTS

(71) Applicant: Skiileux Electricity Inc., Taoyuan (TW)

(72) Inventors: Chien-Shou Liao, New Taipei (TW); Te-Fu Chang, Taichung (TW)

(73) Assignee: Skiileux Electricity Inc., Taoyuan (TW)

( * ) Notice: Subject to any disclaimer, the term of this patent is extended or adjusted under 35 U.S.C. 154(b) by 0 days.

(21) Appl. No.: 16/731,598

(22) Filed: Dec. 31, 2019

(65) Prior Publication Data

US 2021/0043552 A1 Feb. 11, 2021

(30) Foreign Application Priority Data

Aug. 7, 2019 (TW) .................................. 108128102

(51) Int. Cl.
| | |
|---|---|
| *H01L 23/12* | (2006.01) |
| *H01L 23/34* | (2006.01) |
| *H01L 21/00* | (2006.01) |
| *H01L 21/44* | (2006.01) |
| *H01L 23/498* | (2006.01) |
| *H01L 23/00* | (2006.01) |
| *H01L 25/065* | (2006.01) |
| *H01L 25/075* | (2006.01) |
| *H01L 25/00* | (2006.01) |

(52) U.S. Cl.
CPC ...... *H01L 23/49816* (2013.01); *H01L 23/345* (2013.01); *H01L 24/17* (2013.01); *H01L 24/81* (2013.01); *H01L 25/0655* (2013.01); *H01L 25/0753* (2013.01); *H01L 25/50* (2013.01); *H01L 2224/812* (2013.01); *H01L 2224/81007* (2013.01); *H01L 2224/81224* (2013.01)

(58) Field of Classification Search
CPC . H01L 25/0655; H01L 25/0753; H01L 25/50; H01L 23/49816; H01L 23/345; H01L 24/81; H01L 24/17
See application file for complete search history.

(56) References Cited

U.S. PATENT DOCUMENTS

| | | | | |
|---|---|---|---|---|
| 2011/0285005 A1* | 11/2011 | Lin | ....................... | H01L 21/565 |
| | | | | 257/686 |
| 2013/0134606 A1* | 5/2013 | Im | ......................... | H01L 24/32 |
| | | | | 257/778 |

(Continued)

*Primary Examiner* — Alonzo Chambliss
(74) *Attorney, Agent, or Firm* — JCIPRNET (57) ABSTRACT

A film structure, a chip carrier assembly, and a chip carrier device are provided. The film structure includes a film and a plurality of micro-heaters. In which, the film is applied on a substrate, and the plurality of micro-heaters is disposed on top of the film or in the film. The chip carrier assembly includes a circuit substrate and the film structure. In which, the circuit substrate carries a plurality of chips. The chip carrier device includes the chip carrier assembly and a suction unit. In which, the suction unit is arranged above the chip carrier assembly to attach on and transfer the plurality of chips to the circuit substrate. The chips are disposed on the circuit substrate through solder balls, and the micro-heaters heat the solder balls that are in contact with the chips.

20 Claims, 11 Drawing Sheets

(56) References Cited

U.S. PATENT DOCUMENTS

| | | | |
|---|---|---|---|
| 2013/0249228 A1* | 9/2013 | Lai | H01L 21/6838 |
| | | | 294/185 |
| 2015/0305159 A1* | 10/2015 | Yamamoto | H01G 4/40 |
| | | | 361/767 |
| 2018/0160523 A1* | 6/2018 | Kim | H05K 3/4644 |
| 2019/0058099 A1* | 2/2019 | Oh | H01L 33/36 |
| 2020/0227362 A1* | 7/2020 | Thibado | H05K 1/181 |
| 2020/0294879 A1* | 9/2020 | Liao | H01L 25/0753 |

* cited by examiner

MICRO-HEATERS IN A FILM STRUCTURE MOUNTED ON A SUBSTRATE BETWEEN A PLURALITY OF ELECTRONIC COMPONENTS

CROSS-REFERENCE TO RELATED PATENT APPLICATION

This application claims the benefit of priority to Taiwan Patent Application No. 108128102, filed on Aug. 7, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip mounting device, and more particularly to a film structure, a chip carrier assembly and a chip carrier device.

BACKGROUND OF THE DISCLOSURE

In recent years, with the rapid development of electronic technology and semiconductor technology, the latest electronic products have been developed toward being lightweight, slim, and compact. A circuit board is widely adopted in various electronic devices. A plurality of solder pads is often disposed on a surface of the circuit board. In a manufacturing process, a solder material is deposited on the solder pad on the circuit board; further, a number of various electronic components are mounted on the circuit board by a reflow soldering process. The electronic components are electrically connected to one another via a circuit layer in the circuit board.

Conventionally, a number of different heating methods, e.g., by a reflow oven, an infrared lamp, and a heating gun, can be used in the reflow soldering process to perform soldering. Although the above-mentioned heating methods can essentially fulfill a requirement of the reflow soldering process, the process still needs to be improved for better yield and efficiency, and reducing the cost of manufacturing.

SUMMARY OF THE DISCLOSURE

In response to the above-referenced technical inadequacies, the present disclosure provides a film structure, a chip carrier assembly and a chip carrier device.

In one aspect, the present disclosure provides a film structure. The film structure includes a film and a plurality of micro-heaters, in which the film is applied on a substrate, and the plurality of micro-heaters are disposed on top of the film or in the film.

In one aspect, the present disclosure provides a chip carrier assembly. The chip carrier assembly includes a circuit substrate and a film structure including a film and a plurality of micro-heaters. The circuit substrate carries a plurality of chips, and the chips are fixed on the circuit substrate by a solder ball. The film is deposited on the circuit substrate, and the micro-heaters are disposed on the film or in the film for heating the solder balls that are in contact with the chips.

In one aspect, the present disclosure provides a chip carrier device. The chip carrier device includes a chip carrier assembly and a suction unit, in which the chip carrier assembly includes a circuit substrate and a film structure including a film and a plurality of micro-heaters. The film is deposited on the circuit substrate, and the micro-heaters are disposed on top of the film or in the film. The suction unit is arranged above the chip carrier assembly to attach and transfer a plurality of chips to the circuit substrate, in which the chips are disposed on the circuit substrate through a solder ball, and the micro-heaters heat the solder balls that are in contact with the chips.

Therefore, one advantageous effect of the present disclosure is that the film structure provided in the present disclosure can improve the soldering yield in a manufacturing process by the technical feature of "the film structure including a film and a plurality of micro-hearers, the film being applied on a substrate, and the plurality of micro-heaters being disposed on top of the film or in the film."

One of the other advantageous effects of the present disclosure is that the chip carrier assembly can improve the soldering yield in a manufacturing process by the technical feature of "the chip carrier assembly including a circuit substrate and a film structure, the circuit substrate carrying a plurality of chips, the chips being fixed on the circuit substrate by a solder ball, and the film structure including a film and a plurality of micro-heaters. The film is disposed on the circuit substrate, and the micro-heaters are disposed on top of the film or in the film to heat the solder balls contacting the chips."

Another one of the other advantageous effects of the present disclosure is that the chip carrier device can improve the soldering yield in a manufacturing process by the technical feature of "the chip carrier device including a chip carrier assembly and an suction unit, the chip carrier assembly including a circuit substrate and a film structure, the film structure including a film and a plurality of micro-heaters, the film being disposed on the circuit substrate, the micro-heaters being disposed on top of the film or in the film, and the suction unit being arranged above the chip carrier assembly to attaching and transferring a plurality of chips to the circuit substrate. The chips are disposed on the circuit substrate through solder balls, and the micro-heaters heat the solder balls contacting the chips."

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 8, a first embodiment of the present disclosure provides a film structure S1. The film structure S1 includes a film 1 and a plurality of micro-heaters 2. The film 1 is applied on a substrate 3. The plurality of micro-heaters 2 is disposed on top of the film 1 or in the film 1.

Figure 1:
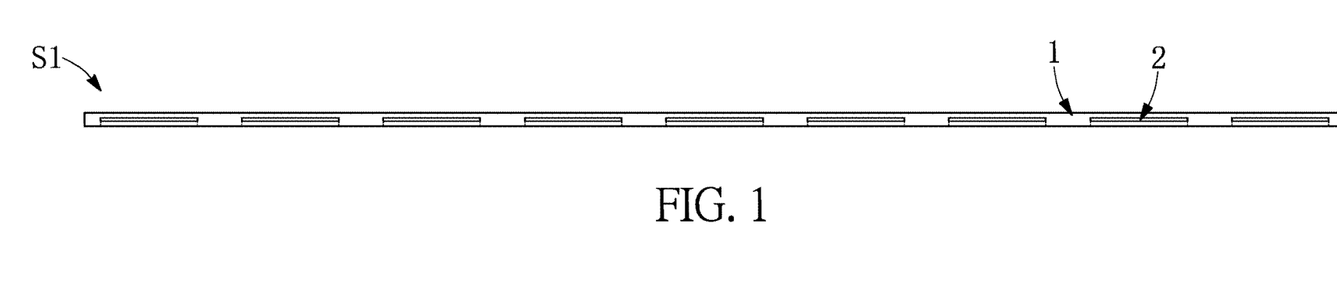
FIG. 1 is a first schematic structural view of a film structure according to a first embodiment of the present disclosure.

Referring to FIG. 1, the film structure S1 provided by the present disclosure includes the film 1 and the plurality of micro-heaters 2. The film 1 can be selected from polyethylene terephthalate (PET), polycarbonate (PC), polyvinyl chloride (PVC), acrylonitrile butadiene styrene (ABS), polyethylene (PE), polypropylene (PP), biaxially-oriented polypropylene (BOPP), and a complex film. However, the present disclosure is not limited thereto. It should be noted that, the plurality of micro-heaters 2 can be partially disposed on top of the film 1, while the remaining part of the micro-heaters 2 is embedded in the film 1.

Figure 2:
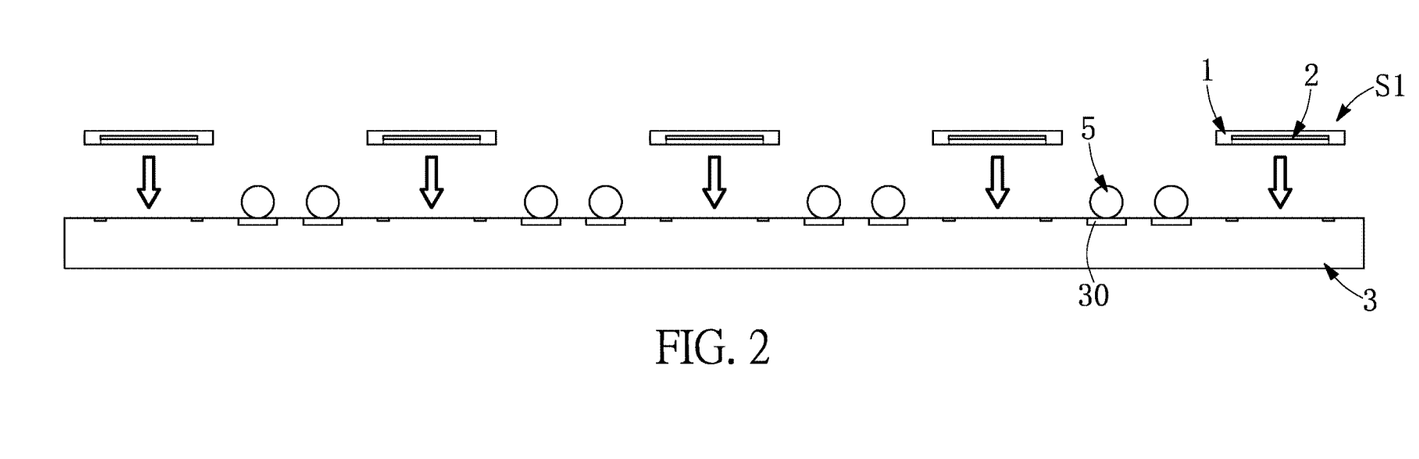
FIG. 2 is a first schematic view of an implementation of the film structure according to the first embodiment of the present disclosure.
Figure 3:
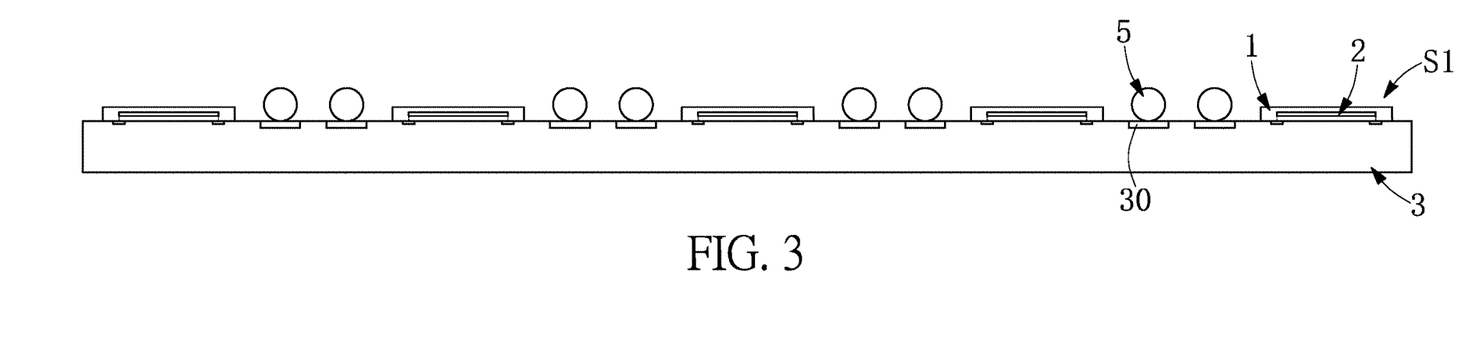
FIG. 3 is a second schematic view of the implementation of the film structure according to the first embodiment of the present disclosure, which also serves as a schematic structural view of a chip carrier assembly of the present disclosure.
Figure 4:
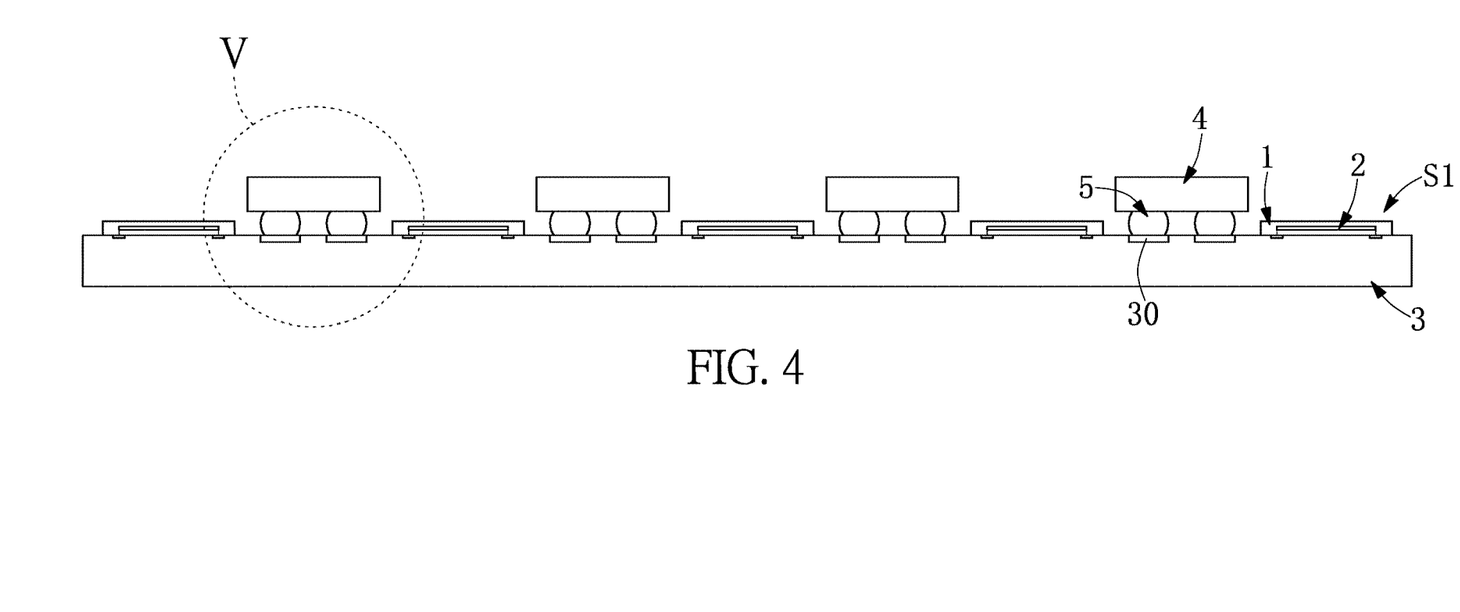
FIG. 4 is a second schematic structure view of the film structure according to the first embodiment of the present disclosure.

Further, referring to FIG. 2 to FIG. 4, the film structure S1 provided by the present disclosure can be applied on the substrate 3. For example, the substrate 3 can be a circuit substrate or a non-circuit substrate, and the substrate 3 includes a plurality of solder pads 30. At least one solder ball 5 can be disposed on each of the solder pads 30. However, the present disclosure is not limited thereto. In an alternative implementation, the solder ball 5 can be predisposed on a chip 4. A plurality of chips 4 can be disposed on the substrate 3 and electrically connected to the solder pads 30 via solder balls 5, in which the chip 4 can be an IC chip or an LED chip. Furthermore, referring to FIG. 4, FIG. 6 and FIG. 7, the film structure S1 can be disposed on two solder pads 30 (exemplified in the present embodiment as being two adjacent solder pads 30, but not limited thereto) or between two solder pads 30. The plurality of micro-heaters 2 can be arranged in series or parallel, and the micro-heaters 2 can be further electrically connected to the substrate 3, but not limited thereto. Moreover, the chip 4 can be disposed beside the micro-heater 2.

Further, referring to FIG. 3 and FIG. 4, by providing electric power to every micro-heater 2 using the substrate 3, each of micro-heaters 2 can heat at least one solder ball 5 corresponding or adjacent thereto in order to soften the solder ball 5, and thus form a connection with the chip 4. Furthermore, after the solder ball 5 is cured, the chip 4 will be fixed on the substrate 3 and electrically connected to the substrate 3 via the solder ball 5. It should be noted that, a feedback circuit unit (omitted in the drawings, the feedback circuit is primarily composed of a driving circuit, a signal reading circuit, and a temperature controlling circuit) can be arranged on the substrate 3 to control the heating temperature of the micro-heater 2.

Figure 5:
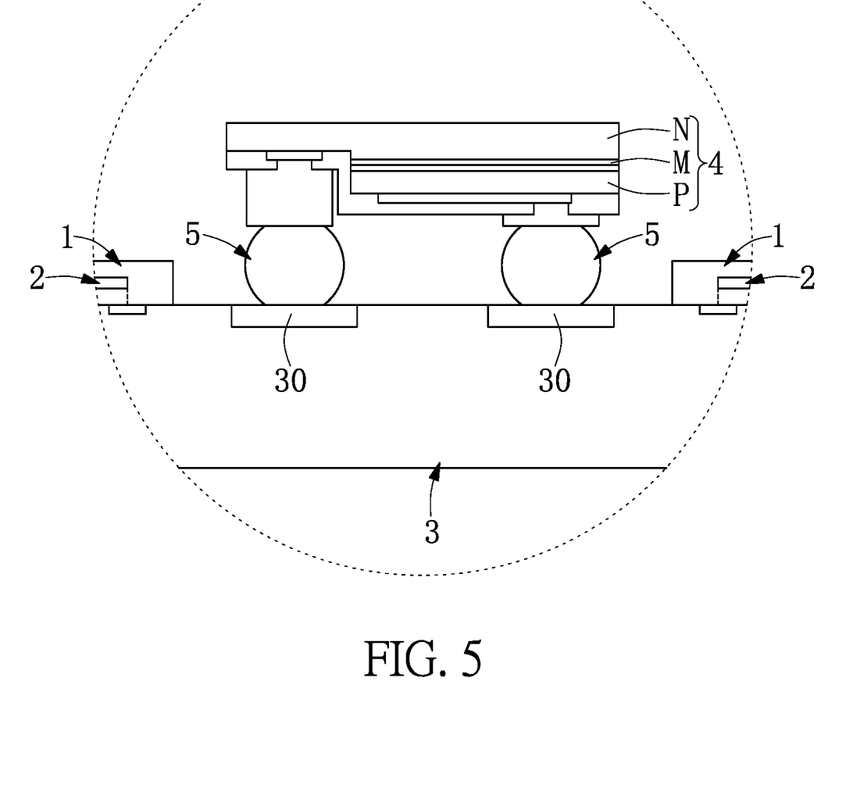
FIG. 5 is an enlarged schematic view of part V of FIG. 4.
Figure 6:
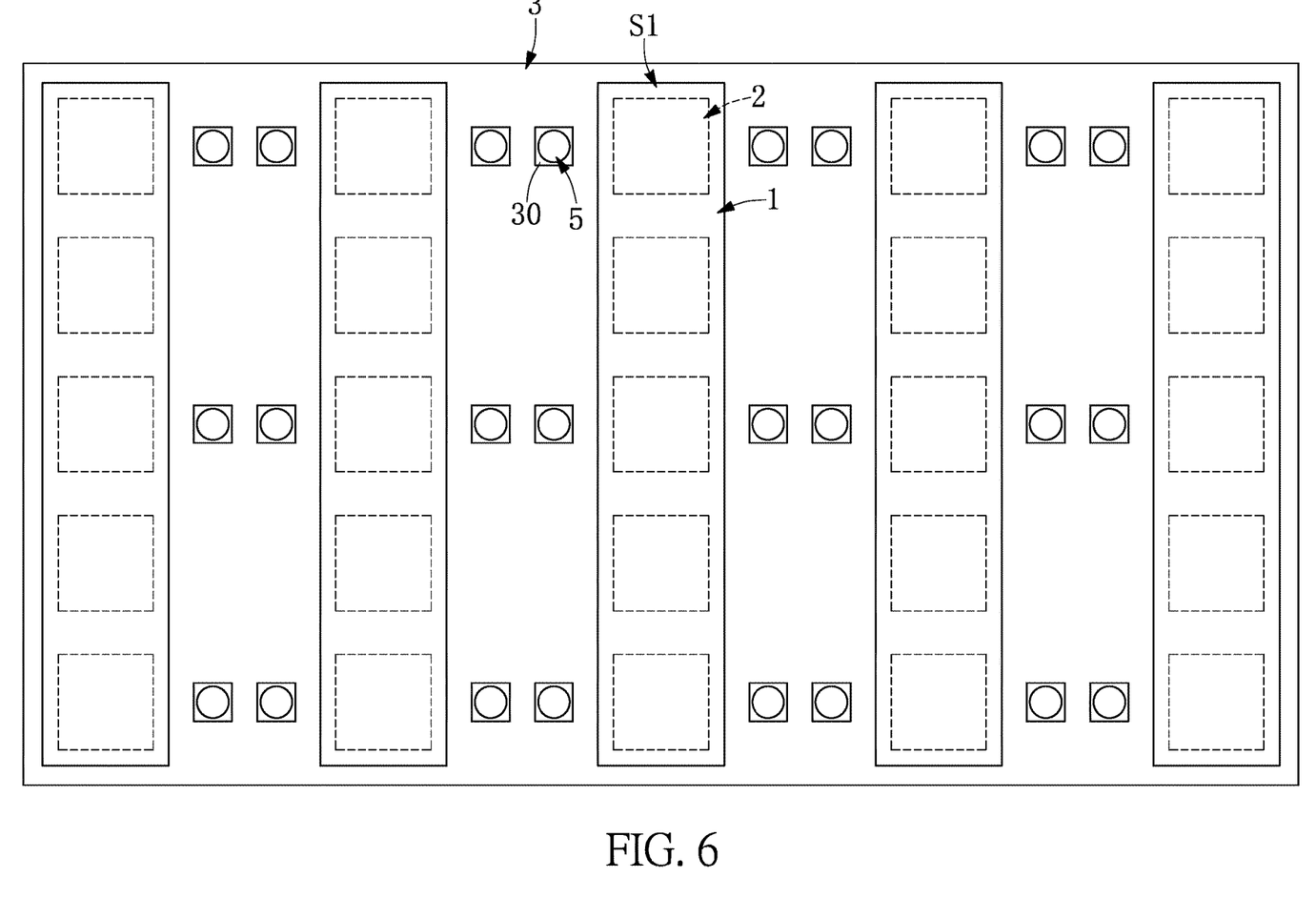
FIG. 6 is a first schematic top view of the film structure applied on a substrate according to the first embodiment of the present disclosure.
Figure 7:
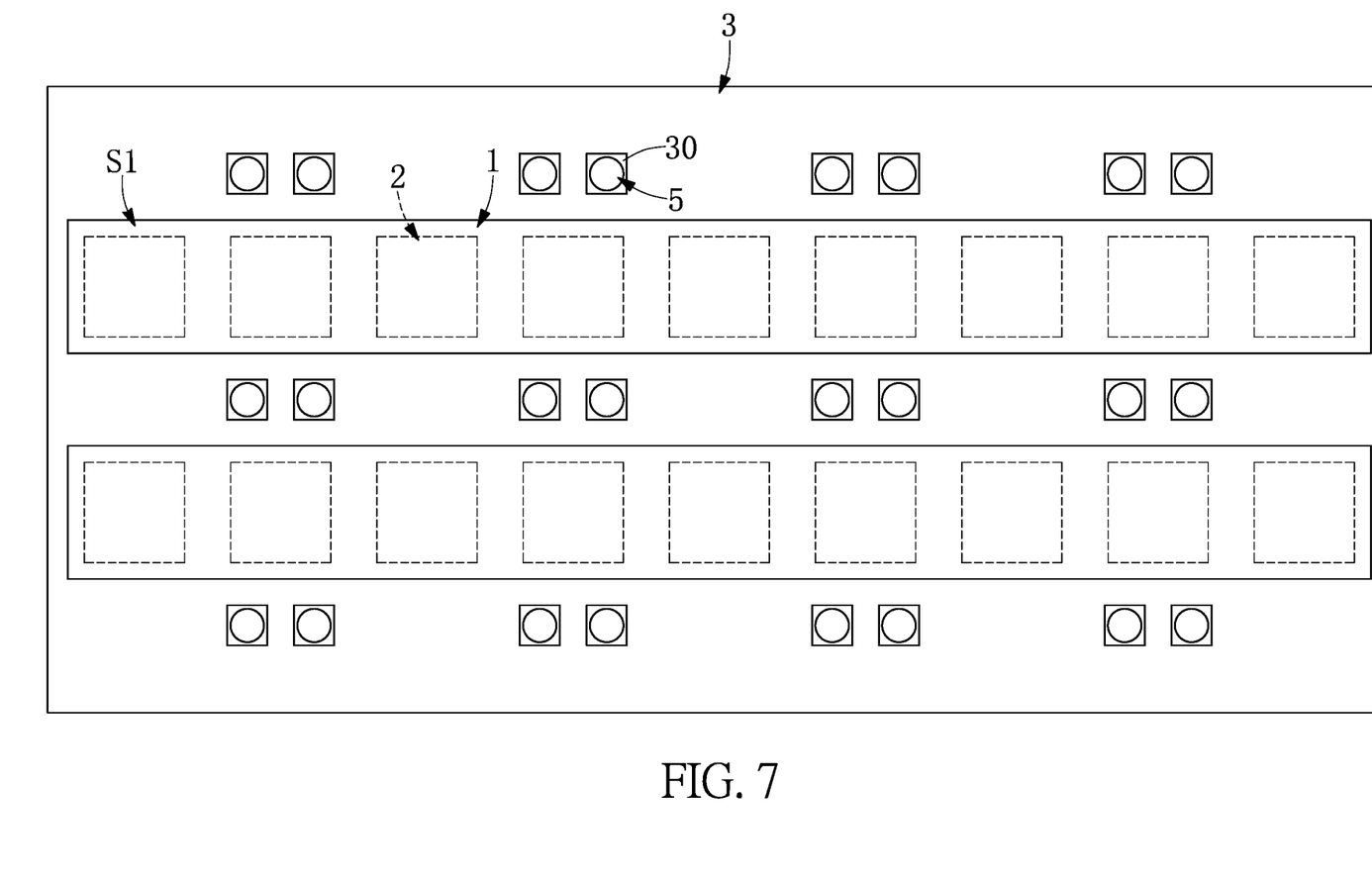
FIG. 7 is a second schematic top view of the film structure applied on a substrate according to the first embodiment of the present disclosure.

Furthermore, referring to FIG. 4 and FIG. 5, every chip 4 can be a micro LED, which includes a stackingly arranged n-type conductive layer N, a light emitting layer M permitting a laser beam, and a p-type conductive layer P. The n-type conductive layer N can be an n-type gallium nitride material layer or an n-type gallium arsenide material layer. The light emitting layer M can be a multiple quantum-well structure layer. The p-type conductive layer P can be a p-type gallium nitride material layer or a p-type gallium arsenide material layer. On the other hand, each of the chips 4 can be a mini LED, which includes a stackingly arranged substrate layer (omitted in the drawings), an n-type conductive layer N, a light emitting layer M transmittable by a laser beam, and a p-type conductive layer P. The substrate layer can be a sapphire material layer. The n-type conductive layer N can be the n-type gallium nitride material layer or the n-type gallium arsenide material layer. The light emitting layer M can be the multiple quantum-well structure layer. The p-type conductive layer P can be the p-type gallium nitride material layer or the p-type gallium arsenide material layer. The substrate layer can alternatively be a quartz substrate layer, a glass substrate layer, a silicon substrate layer, or a substrate layer of any material. However, the present disclosure is not limited to the aforementioned examples.

Figure 8:
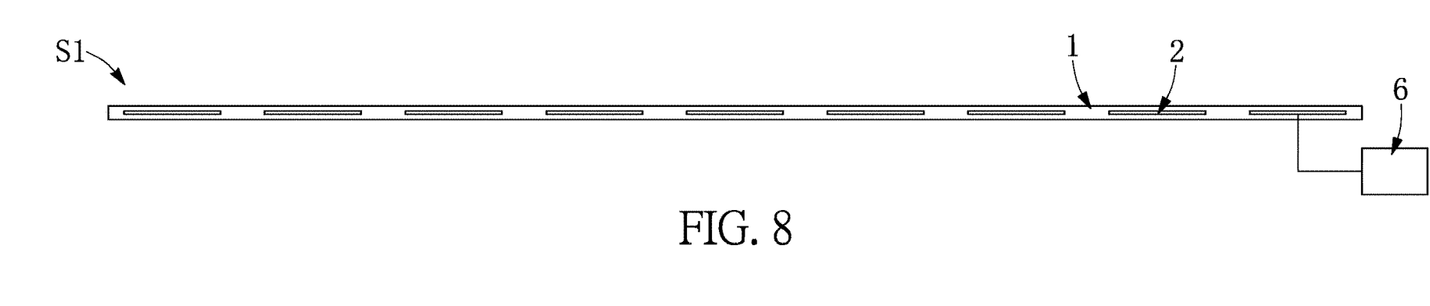
FIG. 8 is a second schematic structure view of the film structure according to the first embodiment of the present disclosure.

Furthermore, referring to FIG. 8, the micro-heater 2 in the film structure S1 provided by the present disclosure can alternatively be insulated from the substrate 3. For example, the plurality of micro-heaters 2 can be arranged in series or parallel, and can be electrically connected to a controller 6 (e.g., a heating controller, but not limited thereto). Therefore, by providing electric power to every micro-heater 2 using the controller 6, each of the micro-heaters 2 can heat at least one corresponding solder ball 5 to soften it and form a connection with the chip 4. It should be noted that, the film structure S1 of the present disclosure can use the feedback circuit unit of the substrate 3 or the controller 6 to control at least one of the micro-heaters 2 to produce heat, and specifically, heat a specific one of the at least one solder ball 5 to attach or detach a specific one of the chip 4.

Figure 10:
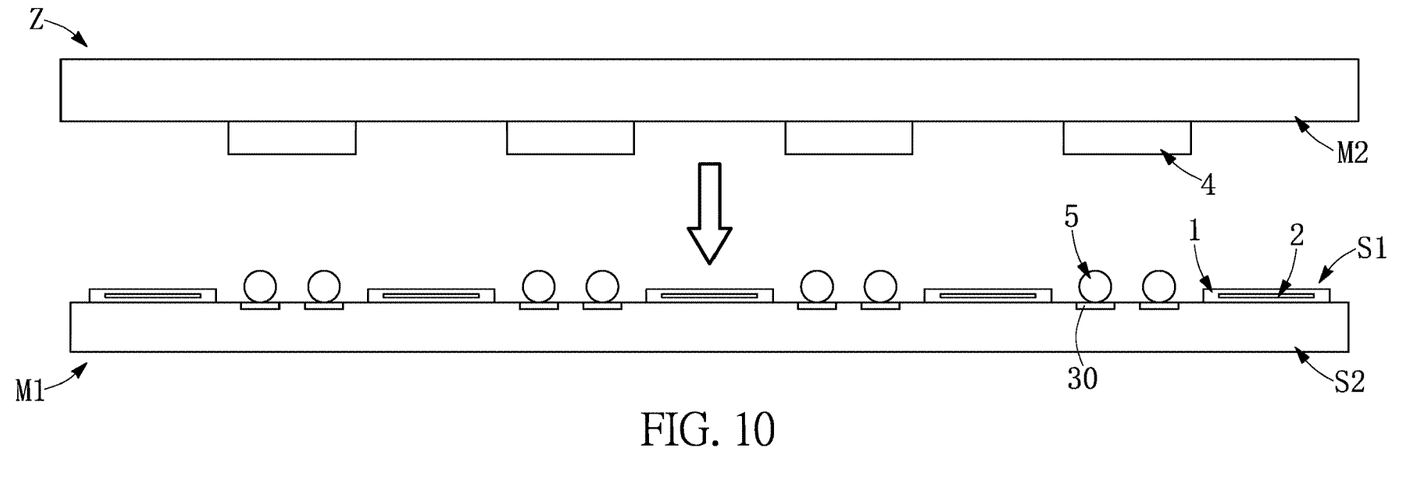
FIG. 10 is a first schematic view of an implementation of a film structure according to a third embodiment of the present disclosure, which also serves as a first schematic view of a structure of the film structure according to the third embodiment of the present disclosure.

According to the aforementioned technical feature, the first embodiment of the present disclosure also provides a chip carrier assembly M1, which includes a circuit substrate S2 (which can also be corresponding to the aforementioned chip 3 as shown in FIG. 10) and the film structure S1. The circuit substrate S2 carries the plurality of chips 4, and the chips 4 are fixed on the circuit substrate S2 by the solder balls 5. The film structure S1 includes the film 1 and the plurality of micro-heaters 2, and the film 1 is disposed on top of the circuit substrate S2. The plurality of micro-heaters 2 is disposed on top of the film 1 or in the film 1 to heat the solder balls 5 contacting the chips 4. Further, the micro-heater 2 is electrically connected to or insulated from the circuit substrate S2, and the chip 4 can be an IC chip or an LED chip. Furthermore, the circuit substrate S2 includes a plurality of the solder pads 30, and the chip 4 is electrically connected to the solder pad 30 via the solder ball 5, in which the chip 4 is disposed on top of the micro-heater 2 or beside the micro-heater 2.

However, the aforementioned example is just one of the practical embodiments, and the present disclosure is not limited thereto.

Second Embodiment

Figure 9:
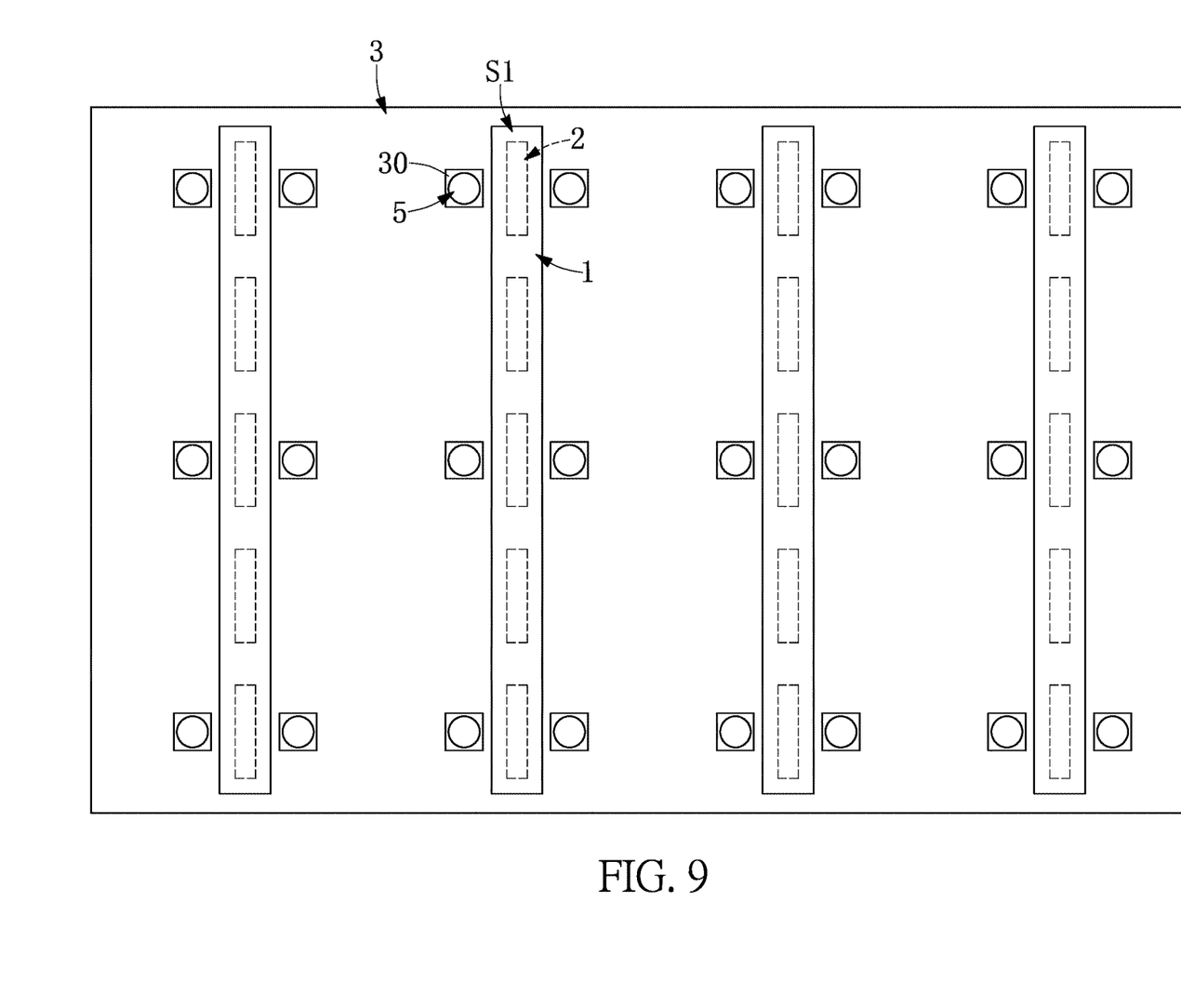
FIG. 9 is a schematic top view of a film structure applied on a substrate according to a second embodiment of the present disclosure.

Referring to FIG. 9 in conjunction with FIG. 1 to FIG. 8, a film structure S1 provided in a second embodiment of the present disclosure is similar to the film structure S1 of the first embodiment. Therefore, descriptions of similar structures, steps, and operations will be omitted herein. The second embodiment is different from the first embodiment in that the film structure S1 of the present embodiment can be disposed between two adjacent solder pads 30. That is, the chip 4 can be disposed on top of the micro-heater 2. For example, referring to FIG. 9, the film structure S1 of the present disclosure can further be disposed between two adjacent solder pads 30 or between two adjacent solder balls 5. In other words, according to the distance between two adjacent solder pads 30 or the distance between two adjacent solder balls 5, or adjustments to the size of the film structure S1, the film structure S1 can be disposed between two adjacent solder pads 30 or between two adjacent solder balls 5.

However, the aforementioned example is just one of the practical embodiments, and the present disclosure is not limited thereto.

Third Embodiment

Referring to FIG. 10 to FIG. 14 in conjunction with FIG. 1 to FIG. 9, a chip carrier device Z is provided in a third embodiment of the present disclosure. The chip carrier device Z includes the chip carrier assembly M1 and a suction unit M2. The chip carrier assembly M1 includes the circuit substrate S2 and the film structure S1 including the film 1 and the plurality of micro-heaters 2. The film 1 is disposed on the circuit substrate S2, and the plurality of micro-heaters 2 is disposed on top of the film 1 on in the film 1.

For example, referring to FIG. 10, the chip carrier assembly M1 includes the circuit substrate S2 and the film structure S1. The circuit substrate S2 can be a singulated substrate or complex substrate, but not limited thereto. The circuit substrate S2 further includes a plurality of solder pads 30, at least one solder ball 5, or other conductive materials in other shapes can be disposed on each of the solder pads 30. The film structure S1 is disposed on the circuit substrate S2, and the film structure S1 includes the film 1 and the plurality of micro-heaters 2. The film 1 can be selected from polyethylene terephthalate (PET), polycarbonate (PC), polyvinyl chloride (PVC), acrylonitrile butadiene styrene (ABS), polyethylene (PE), polypropylene (PP), biaxially-oriented polypropylene (BOPP), and a complex film. However the present disclosure is not limited thereto. The plurality of micro-heaters 2 can be disposed on top of the film 1 or embedded in the film 1. The micro-heater 2 is exemplified to be embedded in the film 1 in the present embodiment, but the present disclosure is not limited thereto.

Figure 11:
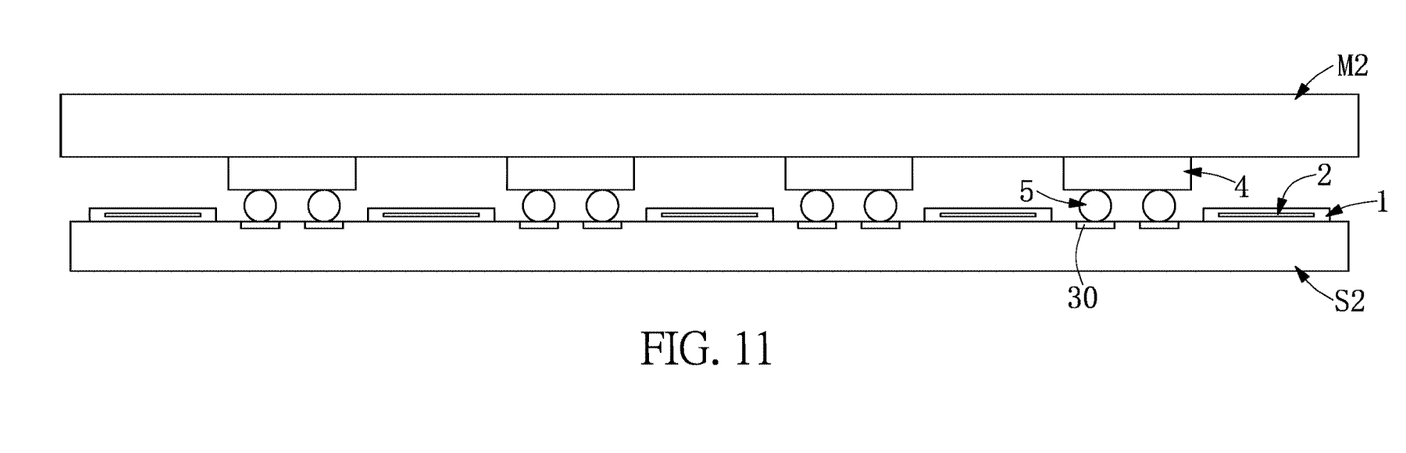
FIG. 11 is a second schematic view of the implementation of the film structure according to the third embodiment of the present disclosure.

Further, referring to FIG. 10 and FIG. 11, the suction unit M2 provided in the present disclosure can be arranged above the chip carrier assembly M1. The suction unit M2 can be made of a transparent material, e.g., glass, and the suction unit M2 can be a vacuum suction module or an electrostatic adsorption module. The electrostatic adsorption module is exemplified in the present embodiment, but the present disclosure is not limited thereto. Therefore, in the present disclosure, by using an electrostatic adsorption force from the suction unit M2 carrying a charge opposite to the chip 4, one or more chips 4 can be attached and placed on the circuit substrate S2. Afterward, by stopping the electrostatic adsorption force from the opposite charges of the suction unit M2, the chip 4 can be carried by the circuit substrate S2, and the chip 4 can be disposed on the circuit substrate S2 through the solder ball 5.

Figure 12:
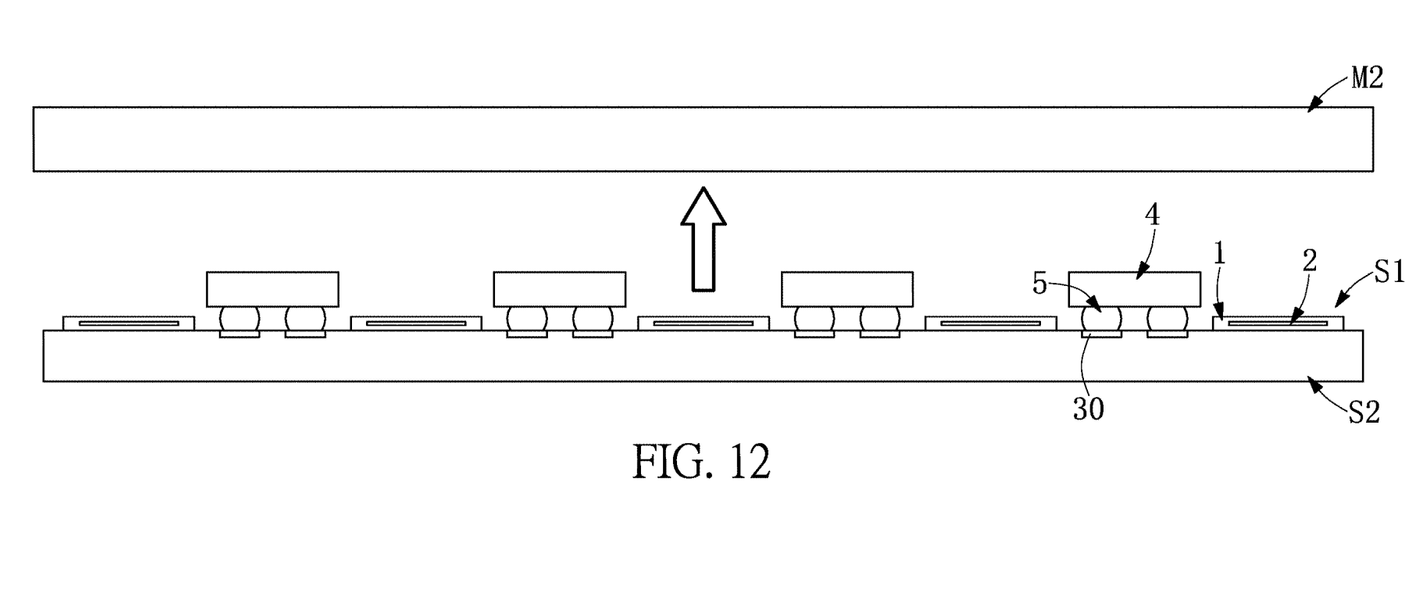
FIG. 12 is a third schematic view of the implementation of the film structure according to the third embodiment of the present disclosure.

Furthermore, referring to FIG. 11 and FIG. 12, by providing electric power to every micro-heater 2 using the circuit substrate S2 or the controller 6, each of the micro-heaters 2 can heat the solder ball 5 contacting the chip 4 to soften the solder ball 5 and form a connection with the chip 4. Subsequently, after the solder ball 5 is cured, it can fix the chip 4 on the circuit substrate S2, and the chip 4 is electrically connected to the solder pad 30 on the circuit substrate S2 via the solder ball 5.

Figure 13:
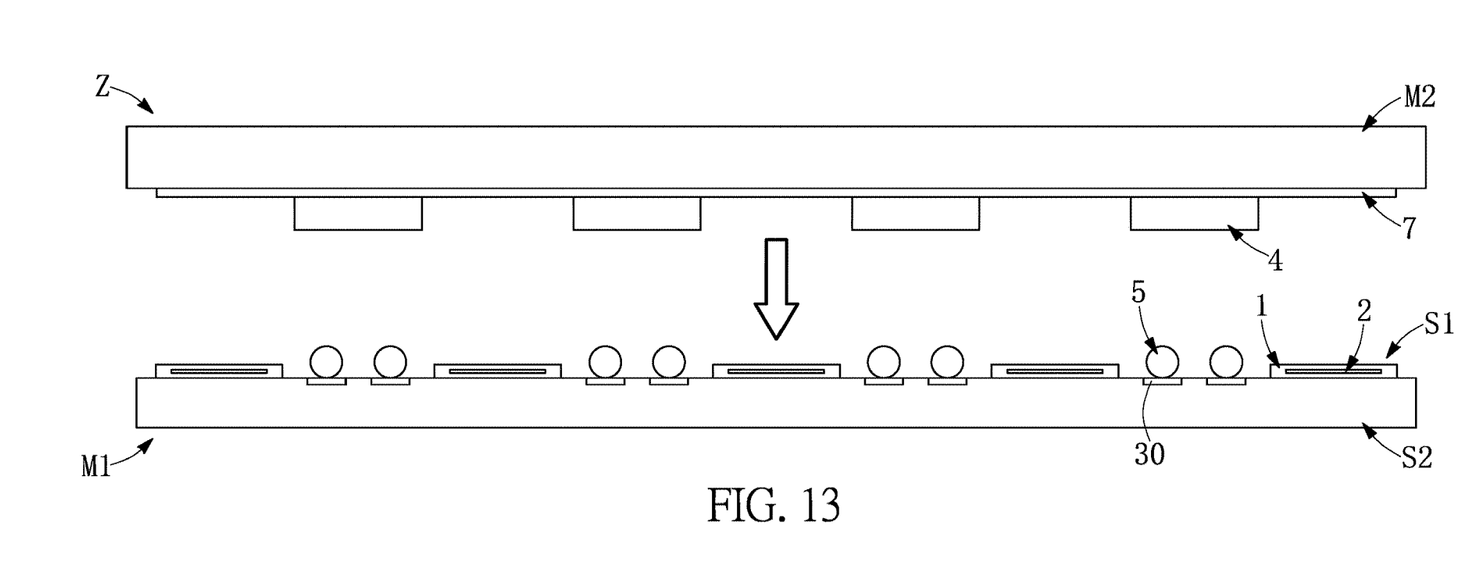
FIG. 13 is a second schematic structure view of the film structure according to the third embodiment of the present disclosure.
Figure 14:
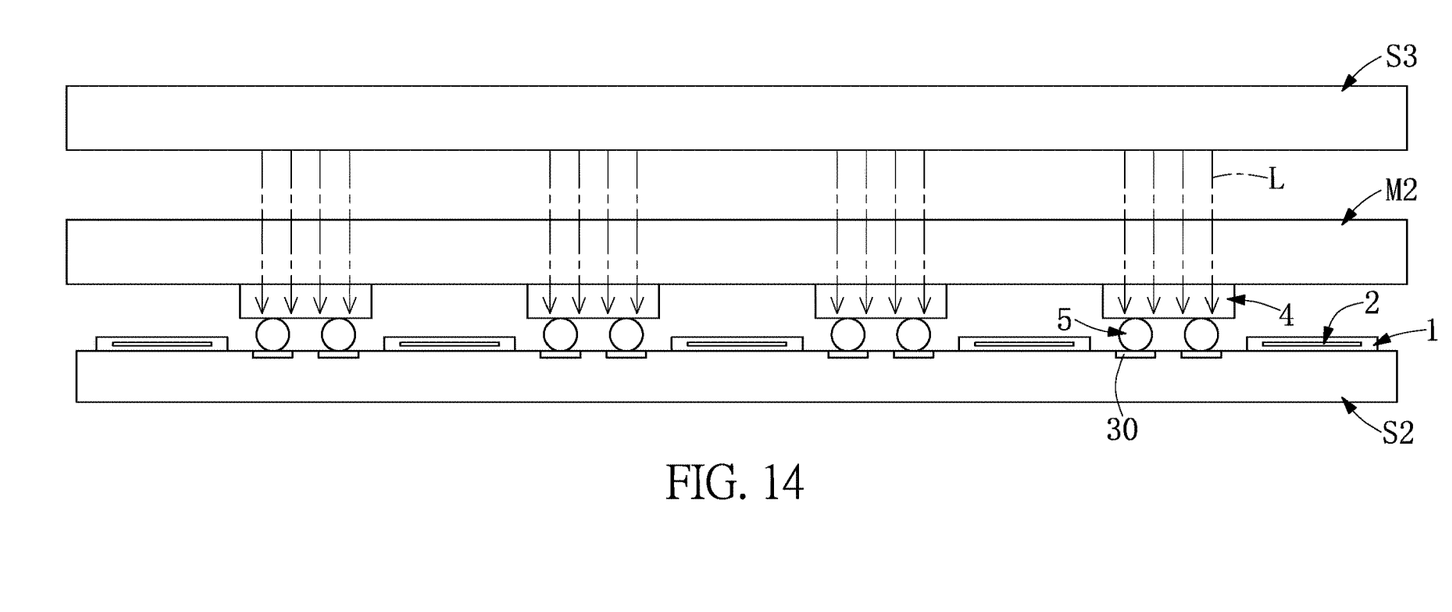
FIG. 14 is a third schematic structure view of the film structure according to the third embodiment of the present disclosure

Furthermore, referring FIG. 13, an adhesive layer 7 can be disposed on the suction unit M2 provided by the present disclosure. The adhesive layer 7 can be selected from polyetheretherketone (PEEK), benzocyclobutene (BCB), and hydrogen silsesquioxane (HSQ), but not limited thereto. For example, by placing the plurality of chips 4 on the adhesive layer 7, one or more chips 4 can be transferred to the circuit substrate S2 by the adhesive layer 7 on the suction unit M2.

Furthermore, the chip carrier device Z provided in the present disclosure further includes a laser heating module S3. The laser heating module S3 is arranged above the film structure S1 to project laser beam L to the solder ball 5. For example, referring to FIG. 14, before every micro-heater 2 heats the solder ball 5, a laser beam L can also be projected on the solder ball 5 by the laser heating module S3. The laser heating module S3 can be arranged above the film structure S1. The laser beam L generated by the laser heating module S3 can transmit through the n-type conductive layer N, the light emitting layer M, and the p-type conductive layer P of the chip 4 and then project on the solder ball 5 on the circuit substrate S2. Furthermore, by preheating the solder ball 5 using the laser heating module S3, the voltage applied to the micro-heater 2 for heating the solder ball 5 can be significantly reduced. In other words, by preheating the solder ball 5 using the laser beam L, the target instant temperature increment demand on the micro-heater 2 can be significantly reduced. For example, if only the micro-heater 2 is used to heat the solder ball 5, the micro-heater 2 is required to instantly reach a target temperature of 700 degrees. However, if the solder ball 5 is preheated by the laser beam L, the micro-heater 2 is only required to instantly reach a target temperature of 400 degrees or lower.

However, the aforementioned example is just one of the practical embodiments, and the present disclosure is not limited thereto.

One advantageous effect of the present disclosure is that the film structure S1 provided by the present disclosure can improve the soldering yield in a manufacturing process by the technical feature of "the film structure S1 including a film 1 and a plurality of micro-hearers 2, the film 1 being applied on a substrate 3, and the plurality of micro-heaters 2 being disposed on top of the film 1 or in the film 1."

One of the other advantageous effects of the present disclosure is that the chip carrier assembly M1 provided in the present disclosure can improve the soldering yield in a manufacturing process by the technical feature of "the chip carrier assembly M1 including a circuit substrate S2 and a film structure S1, the circuit substrate S2 carrying a plurality of chips 4, the chips 4 being fixed on the circuit substrate S2 by a solder ball 5, and the film structure S1 including a film 1 and a plurality of micro-heaters 2. The film 1 is disposed on the circuit substrate S2, and the micro-heaters 2 are disposed on top of the film 1 or in the film 1 to heat the solder balls 5 contacting the chips 4."

Another one of the other advantageous effects of the present disclosure is that the chip carrier device Z provided in the present disclosure can improve the soldering yield in a manufacturing process by the technical feature of "the chip carrier device Z including a chip carrier assembly M1 and an suction unit M2, the chip carrier assembly M1 including a circuit substrate S2 and a film structure S1, the film structure S1 including a film 1 and a plurality of micro-heaters 2, the film 1 being disposed on the circuit substrate S2, the plurality of micro-heaters 2 being disposed on top of the film 1 or in the film 1, and the suction unit M2 being arranged above the chip carrier assembly M1 to attach and transfer a plurality of chips 4 to the circuit substrate S2. The chips 4 are disposed on the circuit substrate S2 through a solder ball 5, and the micro-heaters 2 heat the solder balls 5 contacting the chips 4."

Furthermore, by using the aforementioned technical features, the film structure S1, the chip carrier assembly M1, and the chip carrier device Z provided in the present disclosure can use the micro-heater 2 on the film structure S1 to heat the solder ball 5 on the substrate 3 or the circuit substrate S2, so as to improve the soldering yield in a manufacturing process. In addition, in the present disclosure, a laser beam L generated by a laser heating module S3 can be further configured to preheat the solder ball 5. Therefore, the target temperature that the micro-heater 2 is required to reach in an instant can be significantly reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A film structure, comprising:
    a film applied to a substrate; and
    a plurality of micro-heaters disposed on top of the film or in the film, the plurality of micro-heaters are configured for melting a solder, wherein:
    the plurality of micro-heaters are electrically connected to the substrate, and the plurality of micro-heaters are controlled by a feedback circuit of the substrate; or
    the plurality of micro-heaters are electrically insulated from the substrate, and the plurality of micro-heaters are electrically connected to a controller, and the plurality of micro-heaters are controlled by the controller.

2. The film structure according to claim 1, wherein the substrate is a circuit substrate or a non-circuit substrate.

3. The film structure according to claim 1, wherein the substrate includes a plurality of solder pads, a plurality of electronic components are disposed on the substrate, the plurality of electronic components are electrically connected to the plurality of solder pads via the solder, and the plurality of electronic components are disposed on top of the plurality of micro-heaters or beside the plurality of micro-heaters; wherein the plurality of electronic components include an IC chip or an LED chip.

4. A carrier assembly, comprising:
    a substrate for carrying a plurality of electronic components, wherein the plurality of electronic components are fixed on the substrate by a solder; and
    a film structure including a film and a plurality of micro-heaters, wherein the film is disposed on the substrate, and the plurality of micro-heaters are disposed on top of the film or in the film to heat the solder that are in contact with the plurality of electronic components, the plurality of micro-heaters are configured for melting the solder to be formed between the plurality of electronic components and the substrate, wherein:
    the plurality of micro-heaters are electrically connected to the substrate, and the plurality of micro-heaters are controlled by a feedback circuit of the substrate; or the plurality of micro-heaters are electrically insulated from the substrate, and the plurality of micro-heaters are electrically connected to a controller, and the plurality of micro-heaters are controlled by the controller.

5. The carrier assembly according to claim 4, wherein the the plurality of electronic components include an IC chip or an LED chip.

6. The carrier assembly according to claim 4, wherein the substrate includes a plurality of solder pads, the plurality of electronic components are electrically connected to the plurality of solder pads via the solder, and the plurality of electronic components are disposed on top of the plurality of micro-heaters or beside the plurality of micro-heaters.

7. A carrier device, comprising:
a carrier assembly including a substrate and a film structure, wherein the film structure includes a film and a plurality of micro-heaters, the film is disposed on the substrate, and the plurality of micro-heaters are disposed on top of the film or in the film; and
a suction unit arranged above the carrier assembly to attach onto and transfer a plurality of electronic components to the substrate;
wherein the plurality of electronic components are disposed on the substrate through a solder, and the plurality of micro-heaters heat the solder that are in contact with the plurality of electronic components, wherein the plurality of micro-heaters are configured for melting the solder to be formed between the plurality of electronic components and the substrate, wherein:
the plurality of micro-heaters are electrically connected to the substrate, and the plurality of micro-heaters are controlled by a feedback circuit of the substrate; or
the plurality of micro-heaters are electrically insulated from the substrate, and the plurality of micro-heaters are electrically connected to a controller, and the plurality of micro-heaters are controlled by the controller.

8. The carrier device according to claim 7, wherein the suction unit is a vacuum suction module or an electrostatic adsorption module.

9. The carrier device according to claim 7, further comprising: a laser heating module disposed above the film structure to project a laser beam on the solder.

10. A film structure is disposed on a substrate, comprising:
a film; and
at least one micro-heater formed at the film, wherein the at least one micro-heater is configured for melting at least one solder, wherein:
the at least one micro-heater is electrically connected to the substrate, and the at least one micro-heater is controlled by a feedback circuit of the substrate; or
the at least one micro-heater is electrically insulated from the substrate, and the at least one micro-heater is electrically connected to a controller, and the at least one micro-heater is controlled by the controller.

11. The film structure according to claim 8, wherein the film structure further adapt to at least one electronic component mounted on the substrate, the at least one electronic component electrically connected to the at least one solder, and the at least one micro-heater is configured for melting the at least one solder to be formed between the at least one electronic component and the substrate.

12. The film structure according to claim 11, wherein the at least one electronic component is disposed on the at least one micro-heater.

13. The film structure according to claim 11, wherein the at least one electronic component is beside the at least one micro-heater.

14. The film structure according to claim 13, wherein the film structure is disposed between two adjacent solder.

15. The film structure according to claim 11, wherein the substrate comprises at least one solder pad, and the at least one electronic component is electrically connected to the at least one solder pad via the solder.

16. The film structure according to claim 10, wherein the at least one micro-heater formed on the film.

17. The film structure according to claim 10, wherein the at least one micro-heater formed in the film.

18. The film structure according to claim 10, wherein the at least one micro-heater is partially formed on the film, and the remaining part of the at least one micro-heater is embedded in the film.

19. The film structure according to claim 10, wherein the at least one micro-heater includes a plurality of micro heaters, and the plurality of micro heaters are arranged in series or parallel.

20. The film structure according to claim 10, wherein the film comprises polyethylene terephthalate (PET), polycarbonate (PC), polyvinyl chloride (PVC), acrylonitrile butadiene styrene (ABS), polyethylene (PE), polypropylene (PP), biaxially-oriented polypropylene (BOPP), or a combination thereof.

* * * * *